United States Patent
Kim et al.

(10) Patent No.: US 6,794,730 B2
(45) Date of Patent: Sep. 21, 2004

(54) HIGH PERFORMANCE PNP BIPOLAR DEVICE FULLY COMPATIBLE WITH CMOS PROCESS

(75) Inventors: Youngmin Kim, Allen, TX (US); Shaoping Tang, Plano, TX (US); Seetharaman Sridhar, Richardson, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/028,002

(22) Filed: Dec. 20, 2001

(65) Prior Publication Data

US 2002/0084495 A1 Jul. 4, 2002

Related U.S. Application Data

(60) Provisional application No. 60/259,313, filed on Dec. 31, 2000.

(51) Int. Cl.$^7$ ............... H01L 27/082; H01L 27/102; H01L 29/70
(52) U.S. Cl. .......... 257/565; 257/566; 257/567; 257/568; 257/569; 257/570
(58) Field of Search ............ 281/390, 378, 281/382, 383; 257/591, 592

(56) References Cited

U.S. PATENT DOCUMENTS

| 4,027,324 A | * | 5/1977 | Yagi et al. ............ 357/34 |
| 4,080,619 A | * | 3/1978 | Suzuki et al. ........ 357/34 |
| 5,031,019 A | * | 7/1991 | Kosaka et al. ....... 357/43 |
| 5,060,044 A | * | 10/1991 | Tomassetti .......... 357/43 |
| 5,179,036 A | * | 1/1993 | Matsumoto .......... 437/59 |
| 5,672,897 A | * | 9/1997 | Watanabe et al. ..... 257/370 |
| 6,191,457 B1 | * | 2/2001 | Prengle et al. ...... 257/370 |
| 6,563,193 B1 | * | 5/2003 | Kawaguchi et al. ... 257/575 |

* cited by examiner

Primary Examiner—Jerome Jackson
Assistant Examiner—Jesse A. Fenty
(74) Attorney, Agent, or Firm—Peter K. McLarty; W. James Brady, III; Frederick J. Telecky, Jr.

(57) ABSTRACT

A pnp bipolar junction transistor is formed with improved emitter efficiency by reducing the depth of the p well implant to increase carrier concentration in the emitter and making the emitter junction deeper to increase minority lifetime in the emitter. The high gain BJT is formed without added mask steps to the process flow. A blanket high energy boron implant is used to suppress the isolation leakage in SRAM in the preferred embodiment.

2 Claims, 3 Drawing Sheets

HIGH PERFORMANCE PNP BIPOLAR DEVICE FULLY COMPATIBLE WITH CMOS PROCESS

This application claims the benefit of provisional application Ser. No. 60/259,313 filed Dec. 31, 2000.

BACKGROUND AND SUMMARY OF THE INVENTION

The present invention relates to integrated circuit structures and their fabrication, specifically to bipolar transistors.

BACKGROUND

Bipolar junction transistors (BJTs) are frequently used in integrated circuits, and are often fabricated within the process flow for field effect transistors, such as in a standard CMOS process. The emitter efficiency in a bipolar, which determines the gain of the device, depends heavily on the emitter doping, which in turn depends on the implants used in their formation. Often, implants that exist in the standard CMOS are modified, or new implants are added, in order to create bipolar devices using existing device features. One possibility is to use the source/drain areas of existing devices to form the BJT, or part thereof.

In advanced CMOS process, the source/drain junction becomes very shallow to support a short channel length. In such shallow diffusions, the minority carrier diffusion length in the shallow source/drain junction is determined by the junction depth rather than doping density in the emitter. Thus, efficiency improves when the junction becomes deeper.

In some conventional designs, for example, a vertical pnp BJT is formed by using the p+ source/drain implant to form the emitter, and using p-well and n-well implants to form base and collector. However, the gain of such a BJT is typically only about five, which indicates a very low emitter efficiency.

Vertical PNP Bipolar Device With High Emitter Efficiency

The present application discloses an improvement to the performance of a vertical bipolar transistor which can be obtained using a typical CMOS process without additional mask steps. In the preferred embodiment, the emitter efficiency of a vertical pnp bipolar junction transistor is improved by reducing the depth of the p well implant, increasing dopant concentration in the emitter region and also decreasing the dopant concentration in the base. A high energy blanket boron implant is used in some embodiments for n well to n well isolation.

Advantages of the disclosed methods and structures, in various embodiments, can include one or more of the following:

higher emitter efficiency;

fully compatible with standard CMOS process;

forms a BJT with no added mask steps.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
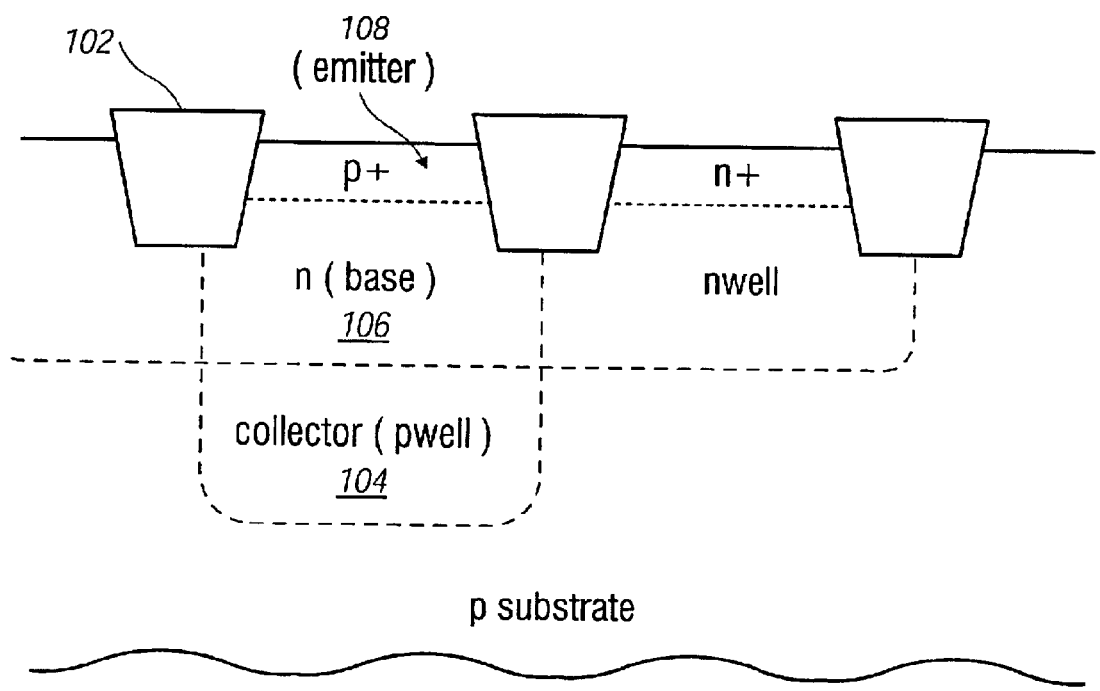
FIG. 1 shows a conventional partially integrated circuit structure.

FIG. 1 shows a cross section of a conventional vertical pnp bipolar junction transistor. A p substrate is used, with shallow trench isolation 102 separating the devices. The collector 104 is formed from the bottom of a p well implant that injects positive charge carriers into the p substrate to a depth of about 1.5 micron and shallower. Boron is a typical dopant material for the p well ion implantation. The net concentration of negative dopant atoms at the n well depth serves as the base 106 for the pnp. The negative dopant concentration for the base peaks at about 0.5 micron in this example. Phosphorus is the negative dopant material in the preferred embodiment, though other materials are possible as well (for example, arsenic). The emitter 108 of the conventional pnp is formed at the top of the structure by implanting more p-type dopants to increase the hole concentration in that region, which increases the emitter efficiency.

Figure 2:
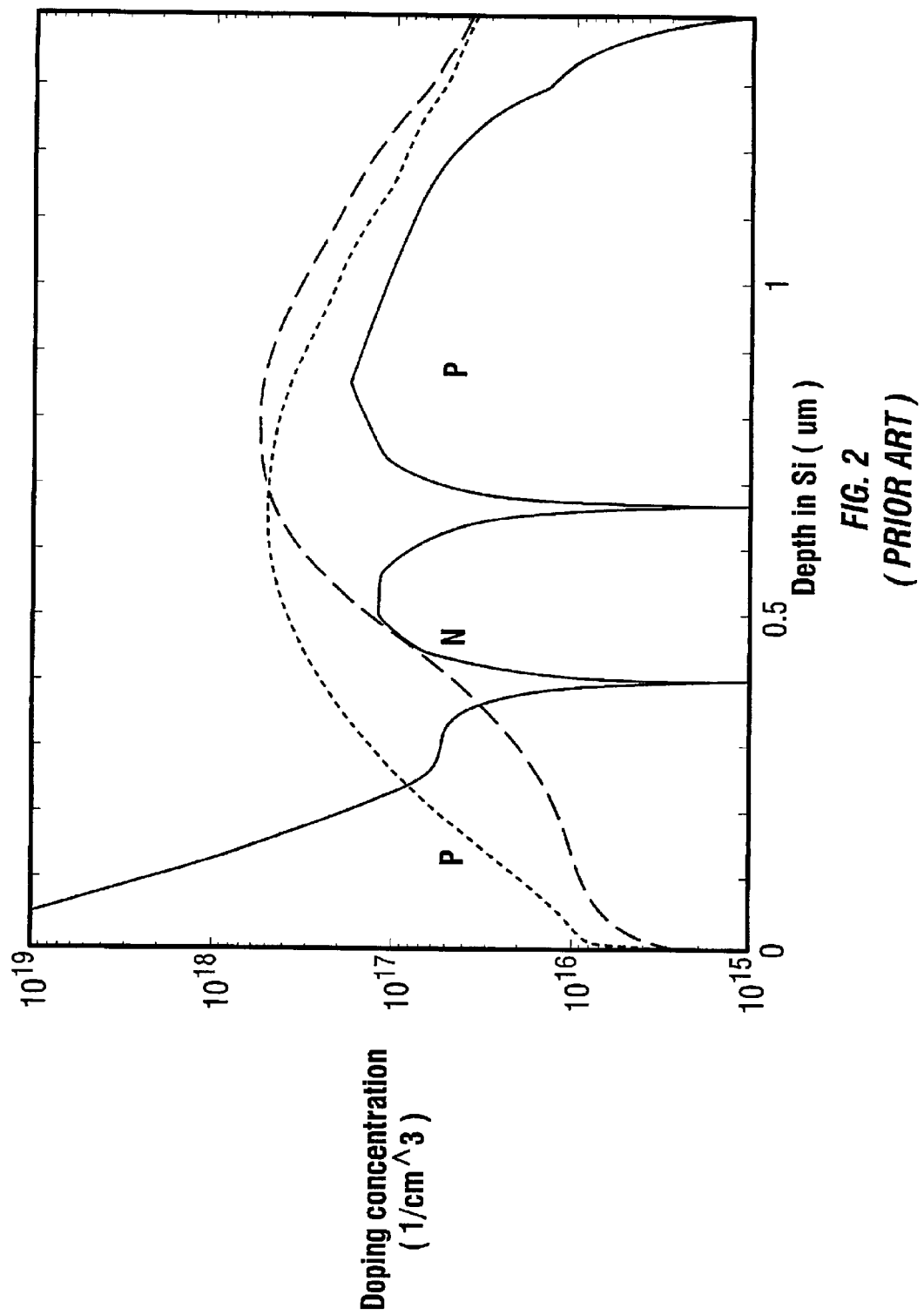
FIG. 2 is a graph showing dopant concentration according to depth.

FIG. 2 shows a profile of the dopant concentration according to depth in the substrate for the conventional process. The dopant concentration (shown by the solid lines and given in terms of number of carriers per cm^3) shows where the peaks of carrier concentration occur and at what depth. The short dashed line represents the phosphorous dopant implantation profile. The longer dashed line shows the p well boron implant profile. In this example, the boron profile peaks at about 0.8 micron, and the n well implant peaks only slightly shallower, at about 0.6 micron. The boron implant was done at 300 KeV at a dosage of 3.5×10^13, and the phosphorous implant was done at 500 KeV. This combination of implants creates a transistor with beta of about 5. Conventional understanding is that the relative position of the n/p well peaks needs to be maintained to suppress the isolation leakage in other CMOS circuits, such as SRAM.

Figure 3:
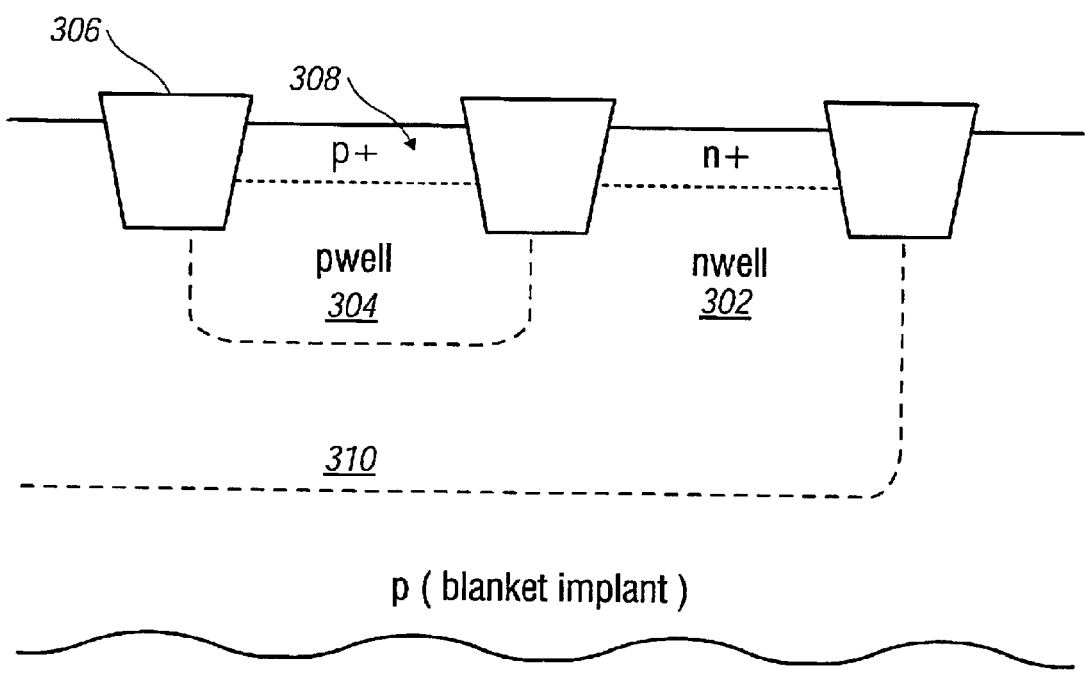
FIG. 3 is a partially fabricated integrated circuit structure according to the preferred embodiment.

FIG. 3 shows a cross section of an innovative vertical pnp transistor. A p substrate with an n well 302 and a p well 304 is again used, with devices separated by STI 306. In the innovative transistor, the emitter 308 efficiency is improved by lowering the implant energy (but not necessarily the dosage) of the p well implant. This causes the implanted ions to be deposited at a shallower depth. The energy is set to increase dopant concentration in the emitter region, which increases emitter efficiency and extends the emitter junction depth, which also helps emitter efficiency. An energy of 225 KeV is used in the preferred embodiment at a dosage of 3.5×10^13. Altering the energy of the positive carrier implantation also affects the final profile of the negative carriers as well. The n well still serves as the base 310 for the pnp. A high energy boron implant is also used in the preferred embodiment, which not only forms the PNP collector but also aids in n well to n well separation.

Figure 4:
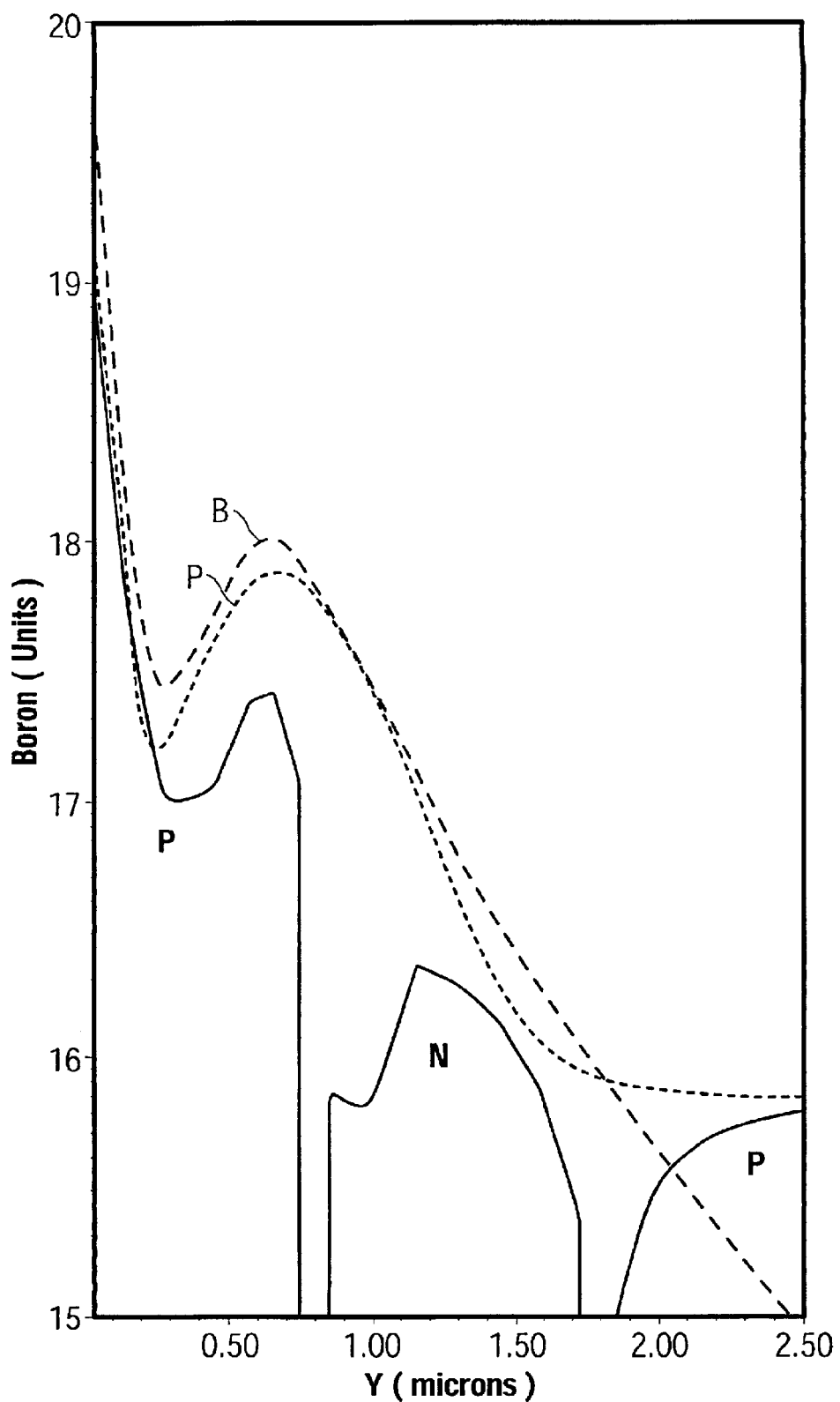
FIG. 4 is a graph showing dopant concentration according to depth.

FIG. 4 shows a profile chart of the dopant concentrations for the preferred embodiment. The p well implant energy is lower than that of FIG. 2, and the positive carriers reside at a shallower depth, increasing carrier concentration in the emitter. The emitter in this embodiment has a peak concentration, at a depth of about 0.65 micron, of over $10^{17}$ per cc. The base doping profile shows a peak, at about 1.2 micron, of slightly more than $10^{16}$ carriers per cubic cm. The collector concentration is much lower than in the conventional model, with a peak of less than $10^{16}$ per cc at a depth of about 2.5 micron or deeper, depending on the energy of the blanket boron implant (or lack thereof).

Note that the blanket boron implant may not be necessary in all embodiments, especially those with a p substrate. In the preferred embodiment, the blanket boron implant is high energy, about 750 KeV at a dosage of $2\times10^{12}$.

FIG. 4 also shows the peaks and concentrations of the n well and p well implants. As in FIG. 2, the n well implant itself peaks at about 0.6 micron in depth, with initial concentration of over $10^{17}$ carriers per unit area. Unlike the conventional method, the p well doping implant now also peaks at about 0.6 micron, shallower than the p well implant of the conventional model. An implant energy of about 225 KeV (a decrease in energy from that shown in FIG. 2) is used in the preferred embodiment. The effect of this shallower implant is shown by the net ion concentrations, discussed above. The emitter concentration is much higher relative to the base concentration as a result. This model yields a beta of about 50, compared to gain of about 5 in the conventional process.

As mentioned earlier, the BJT is formed by using the existing implants done in a standard CMOS flow. In this flow, the p well implant is done first, and then the p+ emitter doping is also enhanced when the p+ source/drain implant is done at a later, existing CMOS process step.

By comparing the profiles of FIGS. 2 and 4, it can be seen that, for very similar CMOS processes, the addition of the disclosed inventions make the emitter-base junction much shallower, and the emitter efficiency much higher.

As one quantitative metric of this, it can be seen that, in FIG. 2, the emitter doping concentration at 75% of the junction depth is approximately 5E16 per cc (at 0.3 microns), and the base doping concentration at 125% of the junction depth is approximately 9E16 (at 0.5 microns). Thus the ratio of these near-junction dopant concentrations is 0.55, i.e. much less than unity.

By contrast, if we apply the same metric to the innovative profile shown in FIG. 4, the ratio of near-junction dopant concentrations is very different. Specifically, the emitter doping concentration at 75% of the junction depth is approximately 3E17 per cc (at 0.6 microns), and the base doping concentration at 125% of the junction depth is approximately 7E16 (at 1.0 microns). Thus the ratio of these near junction dopant concentrations is more than 4:1.

The doping profiles of Figure are of course merely illustrative, and will be varied for different processes, materials, and process generations. However, one of the teachings of the present application is that, in a CMOS process where the N-well implant is used for PNP base doping and the P-well implant is used for PNP emitter doping, the ratio of the ratio of emitter-side to base-side near junction dopant concentrations, calculated as above, should be greater than unity, preferably greater than two, and even more preferably greater than four.

Though the innovative concepts in this application are applicable to BiCMOS processes as well as CMOS (and other process flows as well), the innovations are particularly advantageous in a CMOS process, allowing formation of a high performance BJT without extra mask steps.

According to a disclosed class of innovative embodiments, there is provided: An integrated circuit comprising NMOS transistors in Pwells, PMOS transistors in N-wells, and at least one PNP bipolar transistor having an emitter diffusion which has a doping profile which combines said P-wells with P+ source diffusions of said PMOS transistors, and a base diffusion which at least partly underlies said emitter diffusion, and which has a doping profile which is at least partly the said as said N-wells; said emitter and base diffusions jointly defining an emitter:base ratio of near-junction dopants, measured at 75% and 125% of the emitter-base junction depth, which is greater than two to one.

According to another disclosed class of innovative embodiments, there is provided: An integrated circuit comprising: NMOS and PMOS transistors, and a PNP bipolar transistor which includes a P-type emitter diffusion, having at least one implanted diffusion profile which is the same as at least one implanted diffusion component of p-wells which contain at least some of said NMOS transistors; an N-type base diffusion, having at least one implanted diffusion profile which is the same as at least one diffusion component of n-wells which contain at least some of said PMOS transistors; wherein the peak of said p well is no deeper than the peak of said n well.

According to another disclosed class of innovative embodiments, there is provided: An integrated circuit comprising NMOS transistors in P-wells; PMOS transistors in N-wells; a blanket p-type diffusion, having a peak concentration depth more than twice that of said P-wells; and at least one PNP bipolar transistor having an emitter diffusion which has a doping profile which combines said P-wells with P+ source diffusions of said PMOS transistors, a base diffusion which at least partly underlies said emitter diffusion, and which has a doping profile which is at least partly the said as said N-wells, and a collector diffusion which at least partly underlies said base diffusion, and which has a doping profile which is at least partly the same as said blanket p-type diffusion; said emitter and base diffusions jointly defining an emitter:base ratio of near-junction dopants, measured at 75% and 125% of the emitter-base junction depth which is greater than two to one.

According to another disclosed class of innovative embodiments, there is provided: An integrated circuit fabrication method, comprising the steps of: (a) implanting p-type dopants into p-well locations and PNP emitter locations, but not into all locations; (b) implanting n-type dopants into n-well locations and PNP emitter locations, but not into all locations; (c) implanting p-type dopants into PMOS source/drain locations and PNP emitter locations, with a stopping distance less than half of that used in said step (a); and (d) implanting p-type dopants overall, with a stopping distance more than twice that used in said step (c); whereby emitter efficiency of resulting PNP transistors is improved.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The exact materials used to describe the preferred embodiments are not meant to limit the present applications to those materials, since it will be obvious to those skilled in the art that modifications can be made to the process (such as using alternate dopant materials, for example) without deviating from the contemplation of the present application.

While the inventions have been described with primary reference to a single-poly process, it will be readily recognized that these inventions can also be applied to process with two, three, or more layers of polysilicon or polycide.

It should also be noted that the number of layers of metallization described above does not implicitly limit any of the claims, which can be applied to processes and structures with more or fewer layers.

Similarly, while the contact from first metal to poly and active has been particularly described, it will be readily recognized that the disclosed inventions are equally applicable to processes with multiple layers of metal (and in fact would be most commonly used in such processes).

Similarly, it will be readily recognized that the described process steps can also be embedded into hybrid process flows, such as BiCMOS or smart-power processes.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

It should also be noted that, over time, an increasing number of functions tend to be combined into a single chip. The disclosed inventions can still be advantageous even with different allocations of functions among chips, as long as the functional principles of operation described above are still observed.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTI-LEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing.

What is claimed is:

1. An integrated circuit, comprising:
    at least one PNP bipolar transistor, comprising:
        an emitter diffusion which has a doping profile that combines a P-well and a P+ diffusion;
        a base diffusion comprising a N-well that at least partly underlies said emitter diffusion wherein
        said emitter and base diffusions jointly defining an emitter: base ratio of near-junction dopants, measured at 75% and 125% of the emitter-base junction depth, which is greater than two to one.

2. The integrated circuit of claim 1 further comprising a blanket P-type diffusion component having a peak concentration depth more than twice that of said P-well.

* * * * *